US006463875B1

(12) United States Patent
Chen et al.

(10) Patent No.: US 6,463,875 B1
(45) Date of Patent: *Oct. 15, 2002

(54) MULTIPLE COIL ANTENNA FOR INDUCTIVELY-COUPLED PLASMA GENERATION SYSTEMS

(75) Inventors: Jian J. Chen, Fremont, CA (US); Robert G. Veltrop, Boise, ID (US); Thomas E. Wicker, Reno, NV (US)

(73) Assignee: Lam Research Corporation, Fremont, CA (US)

( * ) Notice: Subject to any disclaimer, the term of this patent is extended or adjusted under 35 U.S.C. 154(b) by 22 days.

This patent is subject to a terminal disclaimer.

(21) Appl. No.: 09/711,935

(22) Filed: Nov. 15, 2000

Related U.S. Application Data

(63) Continuation of application No. 09/106,852, filed on Jun. 30, 1998, now Pat. No. 6,164,241.

(51) Int. Cl.[7] .............................. H05H 1/46; H05H 7/14; H05H 7/02

(52) U.S. Cl. ..................................... 118/723 I; 427/569

(58) Field of Search ....................... 427/569; 118/723 I, 118/723 IR; 216/68, 71

(56) References Cited

U.S. PATENT DOCUMENTS

| | | |
|---|---|---|
| 4,948,458 A | 8/1990 | Ogle |
| 5,231,334 A | 7/1993 | Paranjpe |
| 5,241,245 A | 8/1993 | Barnes et al. |
| 5,261,962 A | 11/1993 | Hamamoto et al. |
| 5,277,751 A | 1/1994 | Ogle |
| 5,280,154 A | 1/1994 | Cuomo et al. |

(List continued on next page.)

FOREIGN PATENT DOCUMENTS

| | | |
|---|---|---|
| EP | 0 759 632 A | 2/1997 |
| EP | 0 810 816 A | 12/1997 |
| EP | 0 833 367 A | 4/1998 |
| EP | 0 838 843 A | 4/1998 |
| JP | 08 148476 A | 6/1996 |

OTHER PUBLICATIONS

Cristal, Edward G., "Coupled Circular Cylindrical Rods Between Parallel Ground Planes," IEEE Transactions on Microwave Theory and Techniques, vol. MTT–12, Jul., 1964, No. 4, pp. 428–439.

Chapman, Brian, "Glow Discharge Processes," John Wiley & Sons, New York, 1980, pp. 156–163. No month.

(List continued on next page.)

Primary Examiner—Marianne Padgett
(74) Attorney, Agent, or Firm—Burns, Doane, Swecker & Mathis, LLP

(57) ABSTRACT

A radio frequency plasma multiple-coil antenna allows for controllable, uniform inductive coupling within a plasma reactor. According to exemplary embodiments, multiple coils are positioned on a dielectric window of a plasma chamber, and are powered by a single radio frequency generator and tuned by a single matching network. Each coil is either planar or a combination of a planar coil and a vertically stacked helical coil. The input end of each coil is connected to an input tuning capacitor and the output end is terminated to the ground through an output tuning capacitor. The location of the maximum inductive coupling of the radio frequency to the plasma is mainly determined by the output capacitor, while the input capacitor is mainly used to adjust current magnitude into each coil. By adjusting the current magnitude and the location of the maximum inductive coupling within each coil, the plasma density in different radial and azimuthal regions can be varied and controlled, and therefore, radially and azimuthally uniform plasma can be achieved.

20 Claims, 5 Drawing Sheets

U.S. PATENT DOCUMENTS

| | | | |
|---|---|---|---|
| 5,392,018 | A | 2/1995 | Collins et al. |
| 5,401,350 | A | 3/1995 | Patrick et al. |
| 5,464,476 | A | 11/1995 | Gibb et al. |
| 5,522,934 | A | 6/1996 | Suzuki et al. |
| 5,525,159 | A | 6/1996 | Hama et al. |
| 5,529,657 | A | 6/1996 | Ishii |
| 5,580,385 | A | 12/1996 | Paranjpe et al. |
| 5,587,038 | A | 12/1996 | Cecchi et al. |
| 5,622,635 | A * | 4/1997 | Cuomo et al. ............... 216/68 |
| 5,690,781 | A * | 11/1997 | Yoshida et al. ............... 216/68 |
| 5,711,850 | A * | 1/1998 | Okumura et al. ............. 216/68 |
| 5,888,413 | A * | 3/1999 | Okumura et al. ............. 216/68 |
| 5,975,013 | A * | 11/1999 | Holland et al. ........... 118/723 I |
| 6,028,395 | A * | 2/2000 | Holland et al. ........... 118/723 I |
| 6,077,384 | A * | 6/2000 | Collins et al. ............ 118/723 I |

OTHER PUBLICATIONS

Liberman, Michael A., Lichtenberg, Allan J., "Principles of Plasma Discharges and Materials Processing," John Wiley & Sons, Inc., New York, 1994, pp. 394–395. No month.

Lamm, Albert J., "Observations of Standing Waves on an Inductive Plasma Coil Modeled as a Uniform Transmission Line," J.Vac. Sci. Technol. A. 15(5), Sep./Oct. 1997, pp. 2615–2622.

International Telephone and Telegraph Corp., "Reference Data for Radio Engineers," $4^{th}$ ed. (1957), pp. 588–599. (No month) New York, NY.

Albert J. Lamm, "Observations of Standing Waves on an Inductive Plasma Coil Modeled as a Uniform Transmission Line," J. Vac. Sci. Tech. A, vol. 15, No. 5, Sep./Oct. 1997, pp. 2615–2622.

* cited by examiner

MULTIPLE COIL ANTENNA FOR INDUCTIVELY-COUPLED PLASMA GENERATION SYSTEMS

This application is a continuation of application Ser. No. 09/106,852, filed Jun. 30, 1998, now U.S. Pat. No. 6,164,241.

FIELD OF THE INVENTION

The present invention relates to plasma reactors for processing materials such as semiconductor substrates. More particularly, the present invention relates to a system for improving the inductive coupling uniformity within plasma reactors.

BACKGROUND OF THE INVENTION

Plasma generation is useful in a variety of semiconductor fabrication processes, for example plasma enhanced etching and deposition. Plasmas are generally produced from a low pressure gas by electric field ionization and generation of free electrons which ionize individual gas molecules through the transfer of kinetic energy via individual electron-gas molecule collisions. The electrons are commonly accelerated in an electric field, typically a radio frequency electric field.

Numerous techniques have been proposed to accelerate the electrons in an RF electric field. For example, U.S. Pat. No. 4,948,458 discloses a plasma generating device in which electrons are excited in a radio frequency field within a chamber using a planar antenna coil that is situated parallel to the plane of a semiconductor wafer to be processed. FIG. 1 schematically illustrates a plasma generating device 100 which includes an antenna system 105, a dielectric window 120, a gas distribution plate 130, a wafer to be processed 140, a vacuum chamber 150, an electrostatic chuck 160, and a lower electrode 170.

In operation, a radio frequency source (not shown) is used to provide a radio frequency current to the antenna system 105, typically via a radio frequency matching circuit (also not shown). The radio frequency current resonates through the antenna system 105, inducing an azimuthal electric field within the vacuum chamber 150. At the same time, a process gas is introduced into the vacuum chamber 150 via the gas distribution plate 130, and the induced electric field ionizes the process gas to produce a plasma within the chamber 150. The plasma then impinges upon the wafer 140 (which (which is held in place by way of the electrostatic chuck 160) and processes (e.g., etching) the wafer 140 as desired. Another radio frequency, at a frequency which is different from that applied to the antenna coil, is typically applied to the lower electrode 170 to provide a negative DC bias voltage for ion bombardment.

FIGS. 2A and 2B depict two planar spiral coils 110a, 110b which make up the antenna system illustrated in the '458 patent. As shown in FIG. 2A, a first planar coil 110a is constructed as a singular conductive element formed into a planar spiral and connected to radio frequency taps 205, 215 for connection to radio frequency circuitry. In FIG. 2B, an alternative planar coil 110b is constructed as a plurality of concentric rings 220 connected in series via inter-connectors 225 and coupled at each end to radio frequency taps 205, 215.

As is well known in the art, the circular current pattern provided by such spiral coils creates toroidal-shaped plasmas which can in turn cause radial non-uniformity in the etch rate at the wafer 140. In other words, the E-field inductively generated by the planar coil antenna 110 is generally azimuthal (having a radial component $E_r=0$ and an azimuthal component $E_\theta \neq 0$), but zero at the center ($E_r=0$ and $E_\theta=0$). Thus, the coil antenna 110 produces a toroidal plasma having a lower density in the center, and must rely on plasma diffusion (i.e., the diffusion of electrons and ions into the center) in order to provide reasonable uniformity at the center of the toroid. In certain applications, however, the uniformity provided by plasma diffusion is insufficient.

Further, such spiral coil antennas tend to make azimuthal non-uniform plasma. This results from the fact that the relatively long lengths of coupling lines used to construct the planar antenna coils have significant electrical lengths at the radio frequency at which they typically operate. The voltage and current waves travel forward from the input end to the terminal end, and will be reflected back at the terminal end. The superposition of the forward and reflected waves results in a standing wave on the coil (i.e., the voltage and current vary periodically along the length of the coil). If the coil is grounded at the terminal end, the current at the terminal end is at a maximum value, and the voltage at the terminal end is zero. Proceeding along the coil toward the input, the voltage increases and the current decreases until, at 90 degrees of electrical length, the voltage is at a maximum and the current is at a minimum. Such a degree of variation results in a highly non-uniform plasma. Consequently, the planar coil is typically terminated with a capacitance such that the current in the coil is similar at both ends of the coil and increases to a maximum near the middle of the coil. Doing so can improve plasma uniformity, but azimuthal non-uniformity still exists because the current varies in the azimuthal direction along the length of the coil. For example, point P in FIG. 2A is the current maximum. On either side of point P the current drops off. Therefore, the power coupling to the plasma is higher beneath P and the corresponding plasma is denser. In contrast, the plasma density at point P' is relatively lower.

Note that, although the terminating capacitor value can be varied, doing so only changes the position of the voltage null along the coil. Further, although the coil can be terminated with an inductance in order to provide the same polarity voltage along the coil length, a current null will exist somewhere in the central portion of the coil (with the current traveling in opposite directions on either side of the null), and the resulting plasma density can be unacceptably low and non-uniform. U.S. Pat. No. 5,401,350 to Patrick et al. attempts to overcome the above-described deficiencies. Therein, a multiple planar coil configuration is set forth in order to improve plasma uniformity. The RF power to the individual coils is independently controlled, requiring separate power supplies and separate matching networks which allow for independent adjustment of the power and phase.

It is evident that a need exists for improved methods and apparatuses for controlling the inductive coupling uniformity within a plasma coupled system.

SUMMARY OF THE INVENTION

The present invention overcomes the above-identified deficiencies in the art by providing a system for improving the inductive coupling uniformity within an antenna system. By controlling the positioning and current distribution of the antenna coils, plasma uniformity can be improved.

According to exemplary embodiments, two or more spiral coils are positioned on a dielectric window of a plasma chamber. Each coil is either planar or a combination of both a planar coil and a vertically stacked helical coil. The input end of each coil is attached to an input variable capacitor and the output end is terminated to the ground through an output variable capacitor. The output capacitor determines where the current is an extreme (i.e., a maximum or a minimum) or the voltage is an extreme, while the input capacitor can change the overall impedance of each coil, and therefore, the ratio of current magnitudes in these multiple coils can be adjusted. By adjusting the magnitude of the current and the location of the maximum current in each coil, plasma density, and therefore, plasma uniformity, can be controlled.

The above-described and other features and advantages of the present invention are explained in detail hereinafter with reference to the illustrative examples shown in the accompanying drawings. Those skilled in the art will appreciate that the described embodiments are provided for purposes of illustration and understanding and that numerous equivalent embodiments are contemplated herein.

DETAILED DESCRIPTION OF THE INVENTION

Figure 1:
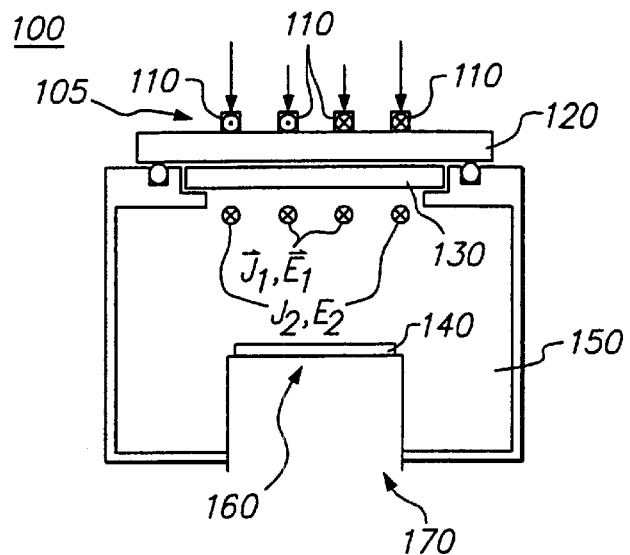
FIG. 1 depicts a plasma reactor wherein an antenna system is placed at the top of the dielectric window and is used to couple radio frequency energy into a processing chamber.
Figure 2A:
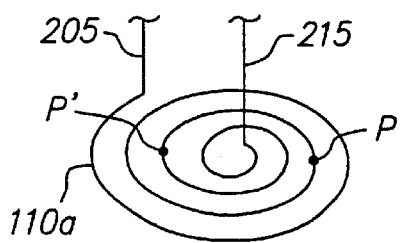
FIGS. 2A and 2B depict two conventional planar spiral coil antennas.
Figure 2B:
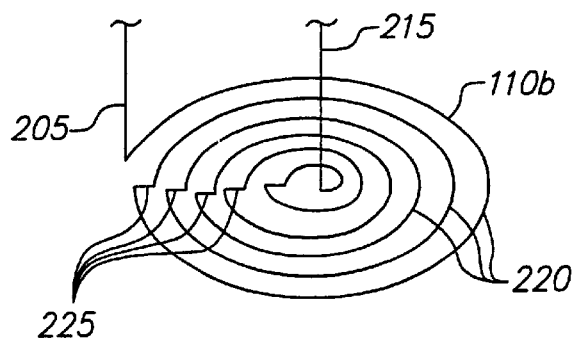

FIG. 1 depicts a plasma generating device 100 in which the antenna system of the present invention may be incorporated. As discussed above, the plasma generating device 100 includes a dielectric window 120, a gas distribution plate 130, a wafer 140, a vacuum chamber 150, an electrostatic chuck 160, a lower electrode 170 and an antenna system 105. The antenna system 105 includes a set of coils 110 which is connected to a RF matching network (not shown) and a RF generator (not shown).

Figure 3:
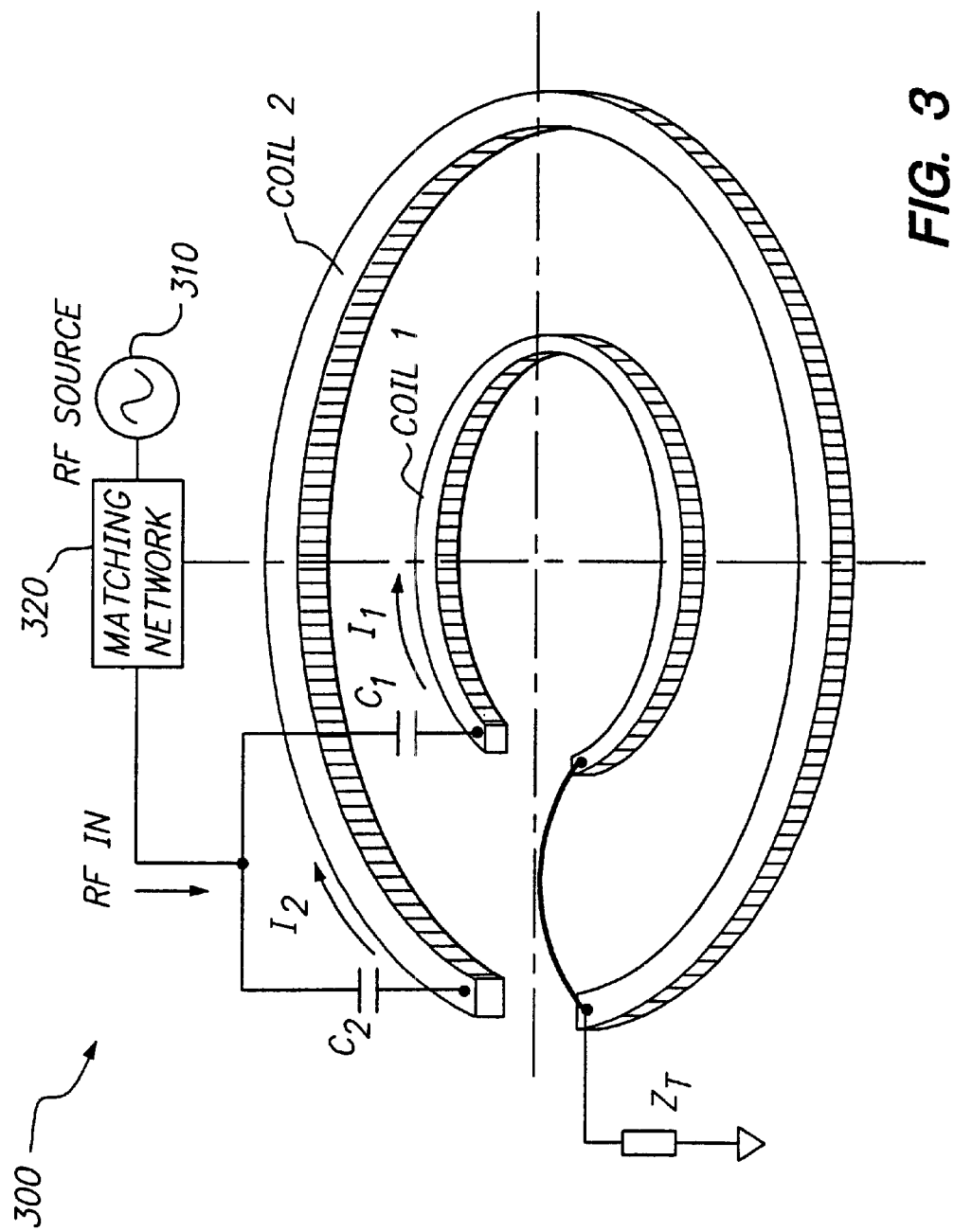
FIG. 3 depicts an exemplary arrangement of dual, single-turn planar coils according to a first embodiment of the present invention.

According to exemplary embodiments of the present invention, the antenna system is a Transformer-Coupled Plasma (TCP™, a registered trademark of Lam Research Corporation) antenna system. FIG. 3 illustrates the TCP™ antenna system 300 according to a first embodiment of the present invention. In this embodiment, the TCP™ system 300 includes two single-turn coils. Coil 1 is preferably placed near the center while Coil 2 is preferably placed further toward the outer edge of the reactor's top opening. A radio frequency (RF) current is simultaneously provided to one end of Coils 1 and 2 via two tuning capacitors $C_1$ and $C_2$. As is well known in the art, the RF input is generated by a RF source 310 and fed to capacitors $C_1$ and $C_2$ through a RF matching network 320. Tuning capacitors $C_1$ and $C_2$ allow for the magnitude of currents $I_1$ and $I_2$ in Coils 1 and 2, respectively, to be adjusted. The opposite ends of Coil 1 and Coil 2 are tied together and terminated to ground through impedance $Z_T$.

The electric field that is inductively generated by a single-turn, planar coil is azimuthal (the radial component $E_r=0$ and an azimuthal component $E_\theta \neq 0$) but zero at the center ($E_r=0$ and $E_\theta=0$). Near the dielectric window surface, the induced E-field and induced current ($J=\sigma E$) in the plasma are almost mirror images of the driving coil. A planar coil antenna produces a toroidal plasma with a radius which is close to one half of the driving coil's radius. By placing two coils apart, this effectively generates a more gradual plasma toroid having a radius that is approximately equal to one half of the mean radii of the two coils. The power coupling to the plasma from the inner coil is localized in the inner region while the power coupling from the outer coil is localized in the outer region. As a result, plasma diffusion (i.e., the diffusion of electrons and ions) tends to make the plasma density more uniform in the center and elsewhere.

As indicated above, the circuitry associated with the two single-turn coils (i.e., the capacitors $C_1$ and $C_2$ and impedance $Z_T$) is capable of adjusting the ratio of current magnitudes in Coil 1 and Coil 2, i.e., $I_1$ and $I_2$, respectively. By adjusting the ratio of current magnitudes, the plasma uniformity between the reactor's center and the edge can be adjusted. As will be appreciated by one skilled in the art, $C_1$ and $C_2$ may be either fixed or variable capacitors.

Input tuning capacitors $C_1$ and $C_2$ partially cancel the input inductive reactance of each coil. With a proper choice of the values for $C_1$ and $C_2$, the input reactance of each leg is the same, resulting in equal input currents into Coil 1 and Coil 2 when fed from a common source. Adjusting $C_1$ higher and $C_2$ lower from these starting values causes decreased current in Coil 1 and increased current in Coil 2. Reversing the direction causes the current to be unbalanced in the opposite direction. The input impedance of the composite circuit remains nominally the same during the adjustment process since one leg has increased reactance while the other leg has decreased reactance.

The opposite ends of Coil 1 and Coil 2 may be terminated with an impedance $Z_T$. $Z_T$ can be a common capacitor, as in conventional TCP™ systems, or an electrically short connection to the ground. $Z_T$ could also be represented as separate capacitors terminated to the ground. If each coil has a different electrical length, the input impedance of each coil is also different. Separate terminating capacitors can be chosen so that the current maximum occurs nominally at the center of each coil length.

When two coils are symmetrically balanced, the currents flowing to each coil are nominally identical. By varying the values of $C_1$ and $C_2$, one skilled in the art will appreciate that unbalanced current flows to Coil 1 and Coil 2 are achieved. Assuming that the input reactances, $X_1$ and $X_2$, are inductive, then when $C_2$ is increased away from the balanced situation for example, $X_2 > X_1$, then $I_1 > I_2$. In this case, the current in the inner coil (Coil 1) is larger than the outer coil which causes stronger inductive coupling in the center of the reactor. As a result, relatively high plasma density is produced in the central region beneath Coil 1. In the alternative, the current in the outer coil (Coil 2) can be adjusted to be larger than that in the inner coil, in order to compensate for lower plasma density in an area surrounding the inner coil, such as near the reactor wall.

The use of two single-turn coils as described above is provided merely for explanatory purposes. One skilled in the art will appreciate that the general principles set forth above are equally applicable to multiple-coil, multiple-turn systems. Furthermore, the present invention is not limited to two dimensional coil configurations (as illustrated in FIG. 3), but may alternatively be implemented as three dimensional coil configurations. For example, the coils can be arranged to conform to a dome-shaped dielectric window or arranged helically around a cylindrical dielectric window. One skilled in the art will appreciate that the principles set forth above are equally applicable to domed, helical, or other three-dimensional configurations having multiple coils with multiple turns.

Figure 4:
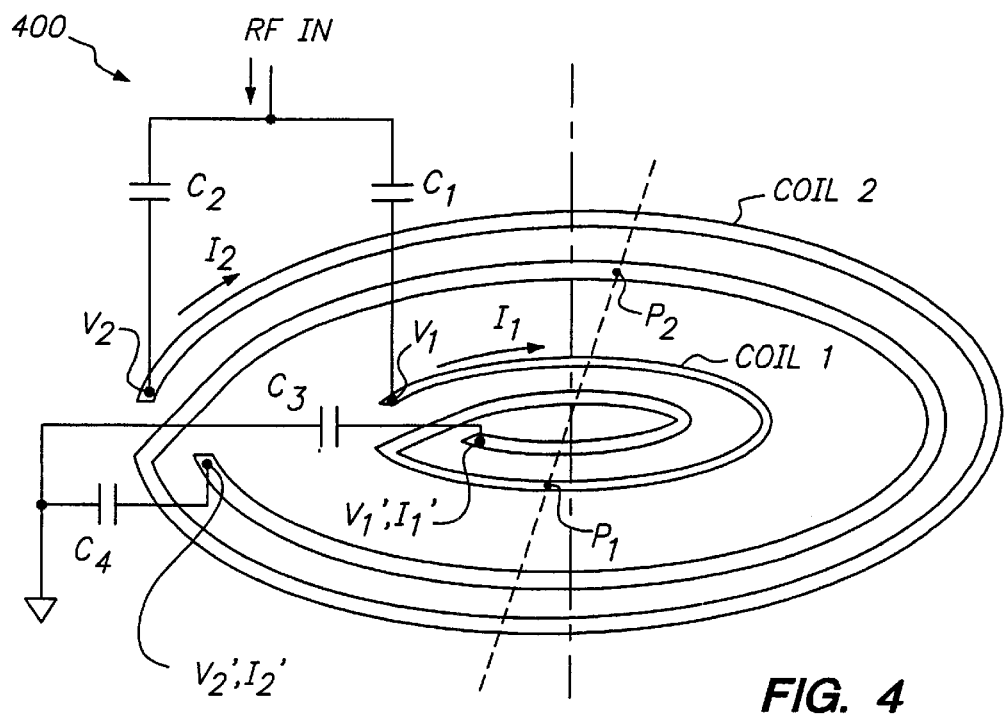
FIG. 4 depicts an exemplary arrangement of dual, multiple-turn planar coils according to a second embodiment of the present invention.

FIG. 4 illustrates the TCP™ antenna system 400 according to a second embodiment of the present invention. In FIG. 4, two multiple-turn coils (Coil 1 and Coil 2) are provided having four tuning capacitors $C_1$–$C_4$ attached thereto. As is evident from the figure, Coil 1 is positioned in the center, while Coil 2 is preferably positioned further toward the outer edge of the reactor's top opening. The RF input is simultaneously fed to a first end of Coils 1 and 2 through tuning capacitors $C_1$ and $C_2$, respectively. The opposite ends of Coils 1 and 2 are terminated through tuning capacitors $C_3$ and $C_4$, respectively. As with the dual-coil single-turn system described above with respect to FIG. 3, the two coils effectively generate a more gradual toroidal-shaped plasma. Since the currents $I_1$ and $I_2$ flow in the same direction, the power couplings to the plasma from the coils spread out over the entire region and produce a single flattened toroidal-shaped plasma. If the currents are unbalanced, the toroidal field can be stronger in the center or at the outside.

Two capacitors are provided for each coil so as to obtain a more symmetric current distribution along the coil. For example, one can adjust $C_1$ together with $C_3$ so that the current maximum (as well as the purely resistive impedance point) occurs at the center of Coil 1. Moving from the center of the coil towards $C_1$, the reactance is inductive, and moving from the center of the coil towards $C_3$ the reactance becomes capacitive, so that the current is maximum in the center and is reduced away from the center in a nominally sinusoidal fashion.

Furthermore, adjustments of $C_3$ and $C_4$ can compensate for the azimuthal non-uniform plasma described above. For example, one can adjust $C_3$ to achieve the maximum current at point $P_1$ of Coil 1 in FIG. 4. As a result, the power coupling to the plasma is higher beneath $P_1$ and the corresponding plasma density is higher. This tends to lead toward azimuthal non-uniformity. However, by adjusting $C_4$, the maximum current can be achieved at location $P_2$ in Coil 2 along the same radial axis opposite $P_1$. Therefore, a higher power coupling of Coil 2 at $P_2$ offsets the effect due to Coil 1, resulting in a more azimuthally uniform plasma. As an alternative to adjusting $C_3$ and $C_4$, the azimuthal position of Coil 1 can be physically rotated relative to that of Coil 2, so that the current maxima in Coil 1 and Coil 2 occur at $P_1$ and $P_2$, respectively.

According to an exemplary embodiment of the present invention, the tuning capacitors, $C_1$ and $C_2$, can be arranged such that they turn in opposite directions with a single control. In this way, the current unbalance and hence, plasma uniformity, can be optimized with a single control from a single generator without disturbing the single conventional matching network at the input. Similarly, adjusting $C_3$ and $C_4$ in opposite directions can have the same effect as adjusting $C_1$ and $C_2$.

As the number of turns in the coils varies, the mutual coupling between the coil and the plasma changes in a manner similar to the mutual coupling between the primary coil (i.e., the driving coil) and secondary coil (i.e., the plasma) of a transformer (see Albert J. Lamm, "Observations of Standing Waves on an Inductive Plasma Coil Modeled as a Uniform Transmission Line," J. Vac. Sci. Tech. A, Vol. 15, No. 5, September/October 1997, p. 2615). An increase/decrease in the number of turns affects the density of the plasma. For example, an increase in the number of turns can cause a reduction in the mutual coupling coefficient which thereby lowers the plasma density. On the other hand, if the coil length is decreased, the overall plasma generation integrated over the coil length can be reduced. Therefore, one skilled in the art will appreciate that it is possible to optimize the number of turns and the overall length of each coil in order to balance these two factors.

In order to illustrate the effect of varying the values of the input tuning capacitors $C_1$ and $C_2$, the following three situations are considered: an initial situation where the value of $C_1$ is larger than that of $C_2$, a second situation where the values of $C_1$ and $C_2$ are adjusted so that they are equal, and a final situation where the value of $C_1$ is less than that of $C_2$.

The complex propagation constant ($k=\alpha+j\beta$) for a TCP™ coil antenna can be deduced from the voltage and current waveform measurements at the input and output of the coil antenna (see Lamm). For purposes of discussion, $\alpha$, $\beta$ and the effective characteristic impedance Zo are assumed to be the same throughout the three situations. Table 1 provides the values for $\alpha$, $\beta$, Zo, the electrical length of each coil, and $C_1$–$C_4$.

TABLE I

Dual-Coil Antenna Circuit as a lossy transmission line-Case (a)

| | $\alpha = 6.89 \times 10^{-4}$/degree Input Capacitors (pF) | $\beta = 1.145$ degree/in Length (degrees) | Zo = 110Ω Output Capacitors (pF) | $Z_{in}$ (Ω) |
|---|---|---|---|---|
| Coil 1 | $C_1$ = 615.2 | 45 | $C_3$ = 257.6 | 4.0 + j26.4 |
| Coil 2 | $C_2$ = 415.2 | 45 | $C_4$ = 257.6 | 4.0 + j17.2 |

In Table I, $Z_{in}$ represents the input impedance of each coil. The overall input impedance of the two coils is 2.1+j 10.5 Ω which is approximately half of $Z_{in}$ for each coil. Table II lists the magnitudes and phase angles of $I_i$, $I_i'$, $V_i$, and $V_i'$ for the i-th coil when an input RF power of 1000 W and the parameters described in Table I are provided. In Table II, $I_i$ represents the current at the input end (closer to RF input in FIG. 4) of the i-th coil (i=1, 2), $I_i'$ represents the current at the output end (closer to $C_3$ and $C_4$ in FIG. 4) of the i-th coil, and $V_1$ and $V_i'$ represent the voltage at the input and the output ends of the i-th coil, respectively.

TABLE II

The RF currents and voltages at the input and the output of the two coils

| i-th coil | Input Current | | Output Current | | Input Voltage | | Output Voltage | |
|---|---|---|---|---|---|---|---|---|
| | $(I_i)$rms | Angle | $(I_i')$rms | Angle | $(V_i)$rms | Angle | $(V_i')$rms | Angle |
| Coil 1 | 8.7 A | −3° | 8.7 A | −3° | 399 V | +82° | 398 V | −93° |
| Coil 2 | 13.2 A | +2° | 13.2 A | +1° | 603 V | +87° | 601 V | −89° |

As is evident from Table II, the RF current and voltage are unbalanced between the two coils, but are balanced within each coil. Both the current and voltage in the inner coil (Coil 1) are 34% less than those in the outer coil (Coil 2) since the overall impedance of the inner coil is higher than that of the outer coil. Each coil is symmetrically balanced around the coil center, so that the values of the input current and voltage in each coil are almost equal to the output values in magnitude. Away from each coil's center the impedance is inductively-dominated toward the input end of the coil and capacitively-dominated toward the output end; this is evident from the phase angle change between the input and output voltage.

The effect of varying the values of $C_1$ and $C_2$ (so that $C_1=C_2$) on the currents $I_1$ and $I_2$ is set forth in Tables III and IV below.

TABLE III

Dual-Coil Antenna Circuit as a lossy transmission line-Case (b)

| | $\alpha = 6.89 \times 10^{-4}$/degree Input Capacitors (pF) | $\beta = 1.145$ degree/in Length (degrees) | $Zo = 110\Omega$ Output Capacitors (pF) | $Z_{in}$ ($\Omega$) |
|---|---|---|---|---|
| Coil 1 | $C_1 = 515.2$ | 45 | $C_3 = 257.6$ | 4.0 + j22.7 |
| Coil 2 | $C_2 = 515.2$ | 45 | $C_4 = 257.6$ | 4.0 + j22.7 |

The overall input impedance of the two coils is 2.0+ j11.4Ω which is approximately half of $Z_{in}$ for each coil. Table IV lists the magnitudes and phase angles of $I_1$, $I_i'$, $V_i$, and $V_i'$ for the i-th coil when an input RF power of 1000 W and the parameters described in Table III are provided.

TABLE IV

The RF currents and voltages at the input and the output of the two coils

| i-th coil | Input Current | | Output Current | | Input Voltage | | Output Voltage | |
|---|---|---|---|---|---|---|---|---|
| | $(I_i)$rms | Angle | $(I_i')$rms | Angle | $(V_i)$rms | Angle | $(V_i')$rms | Angle |
| Coil 1 | 11.2 A | 0° | 11.2 A | −1° | 511 V | +85° | 510 V | −91° |
| Coil 2 | 11.2 A | 0° | 11.2 A | −1° | 511 V | +85° | 510 V | −91° |

Since $C_1=C_2$ and $C_3=C_4$, and Coil 1 is identical to Coil 2, the RF current and voltage are balanced between the two coils as well as within each coil.

The final situation illustrates the effect of varying the values of $C_1$ and $C_2$ such that the value of $C_1$ is less than that of $C_2$.

TABLE V

Dual-Coil Antenna Circuit as a lossy transmission line-Case (c)

| | $\alpha = 6.89 \times 10^{-4}$/degree Input Capacitors (pF) | $\beta = 1.145$ degree/in Length (degrees) | $Zo = 110\Omega$ Output Capacitors (pF) | $Z_{in}$ ($\Omega$) |
|---|---|---|---|---|
| Coil 1 | $C_1 = 415.2$ | 45 | $C_3 = 257.6$ | 4.0 + j17.2 |
| Coil 2 | $C_2 = 615.2$ | 45 | $C_4 = 257.6$ | 4.0 + j26.4 |

The overall input impedance of the two coils is 2.1+ j10.5Ω which is approximately half of $Z_{in}$ for each coil. Table VI lists the magnitudes and phase angles of $I_i$, $I_i'$, $V_i$, and $V_i'$ for the i-th coil when an input RF power of 1000 W and the parameters described in Table V are provided.

TABLE VI

The RF currents and voltages at the input and the output of the two coils

| i-th coil | Input Current | | Output Current | | Input Voltage | | Output Voltage | |
|---|---|---|---|---|---|---|---|---|
| | $(I_i)$rms | Angle | $(I_i')$rms | Angle | $(V_i)$rms | Angle | $(V_i')$rms | Angle |
| Coil 1 | 13.2 A | −2° | 13.2 A | −1° | 603 V | +87° | 601 V | −89° |
| Coil 2 | 8.7 a | −3° | 8.7 a | −3° | 399 v | +82° | 398 V | −93° |

In this case, both the RF current and voltage in the inner coil (Coil 1) are 51% greater than those in the outer coil (Coil 2).

It is evident from the above situations that, by only varying $C_1$ and $C_2$, the current as well as the voltage in a coil can be adjusted substantially with respect to the current and voltage in the other coil.

Figure 5:
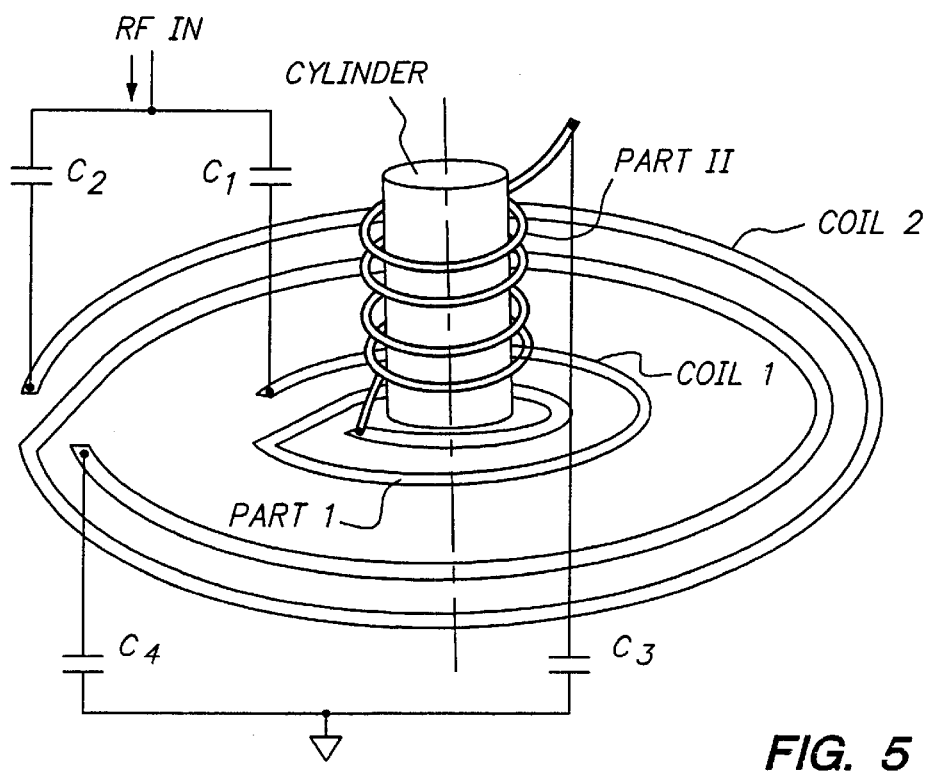
FIG. 5 depicts an exemplary arrangement of dual, multiple-turn planar coils with an inner helical coil according to a third embodiment of the present invention.

FIG. 5 illustrates a third embodiment of the present invention. In FIG. 5, a helical coil, in addition to two multiple-turn coils and four tuning capacitors $C_1$–$C_4$, is provided. According to this embodiment, the inner coil (Coil 1) consists of two parts. Part I represents the planar multiple-turn coil described above with respect to FIG. 4. Part II represents a helical coil which is placed vertically with respect to the planar multiple-turn coil and has an axis identical to the axis of the planar coils (Part I of Coil 1 and Coil 2).

In this embodiment, the electrical length for the inner coil is increased so that Coil 1 and Coil 2 are more balanced in terms of their electrical lengths. When two electrical lengths are close to each other, the current to each coil can be adjusted to a greater extent while maintaining a more constant composite input impedance. The helical coil, according to the present invention, aids in the inductive coupling to the plasma in the center. Although the E-field generated by the helical coil is also azimuthal and is zero in the center, the mean radius of this azimuthal E-field is in the order of the diameter of the helical coil. As a result, the plasma in the center can be made more dense to provide better overall uniformity.

The cylinder in the middle of the helical coil is made of a dielectric material and can be either solid in which case the cylinder merely provides mechanical support for the helix or hollow along its axis. In the latter case, the hollow cylinder is vacuum sealed on the top end and opened on the bottom end so that the hollow section of the cylinder is directly connected to the chamber. In such a case, the process gas is introduced not only to the vacuum chamber, but also to the hollow cylinder. The cylinder would be considered to be part of the dielectric window of the plasma reactor. The plasma density in the hollow cylinder can be higher than that in the chamber due to a relatively strong induced field and the hollow cathode effect. The plasma which is remotely produced in the hollow cylinder diffuses into the chamber's center. Moreover, relatively high voltage can be adjusted by the termination capacitor $C_3$, such that discharge can be easily struck at a low pressure regime, typically less than 10 m-Torr.

Figure 6:
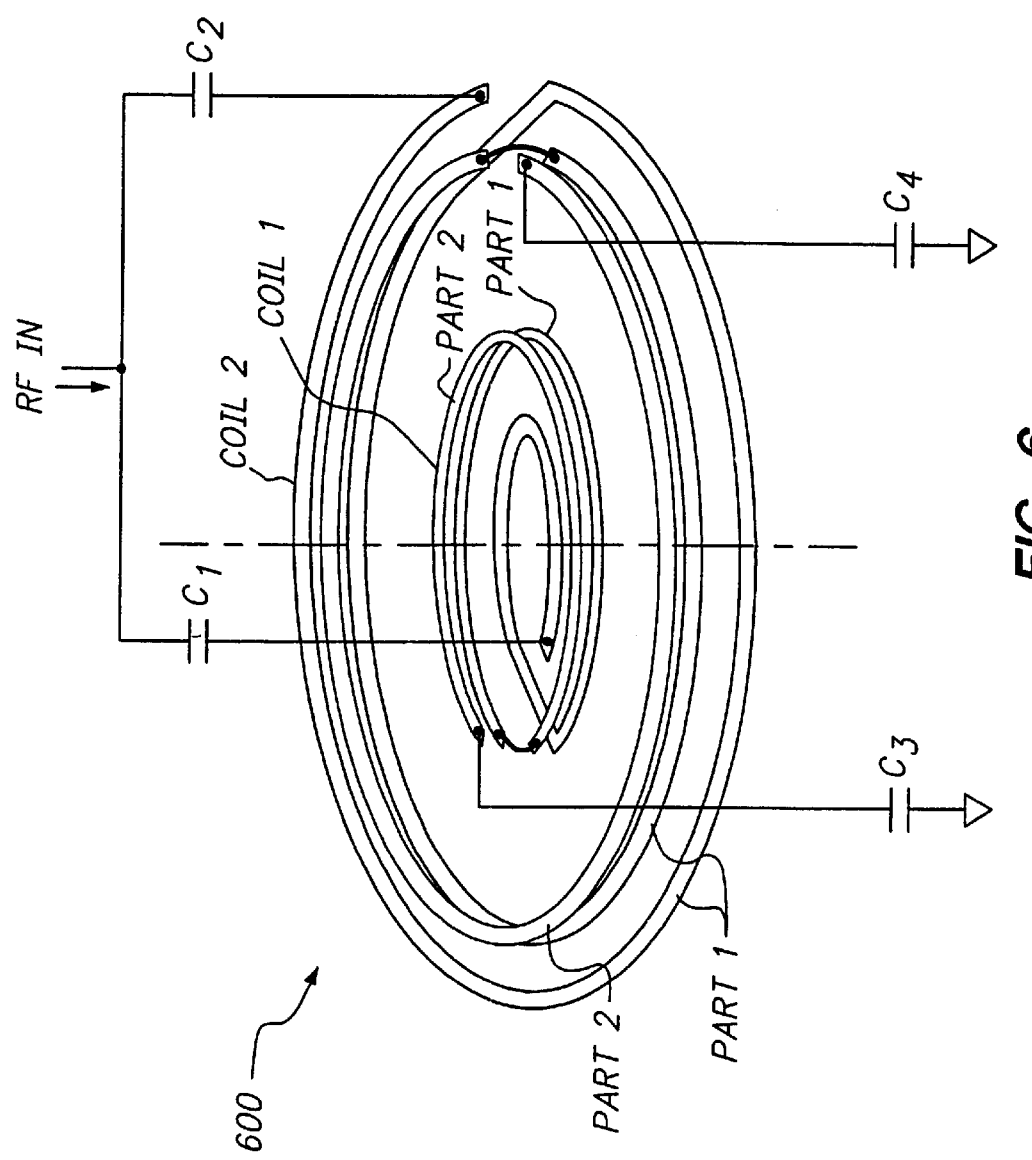
FIG. 6 depicts an exemplary arrangement of dual, multiple-turn planar coils, with both inner and outer helical coils according to a fourth embodiment of the present invention.

FIG. 6 illustrates a fourth embodiment of the present invention. According to this embodiment, each coil (Coil 1 and Coil 2) consists of two parts. Part 1 is configured as a planar multiple-turn coil while Part 2 is configured as a helical coil, which is placed vertically with respect to the planar multiple-turn coil (i.e., Part 1) and has an axis identical to the axis of Part 1.

The input radio frequency enters the antenna system 600 through the planar multiple-turn coils in Coil 1 and Coil 2, and exits through the helical coils, such that the current flows in the same direction in both coils. In order to have comparable electrical lengths for Coil 1 and Coil 2, the helical coil (Part 2) in Coil 2 preferably has the same radius as that of the most inner turn of the planar multiple-turn coil (Part 1 of Coil 2), while the helical coil (Part 2) in Coil 1 preferably has the same radius as that of the most outer turn of the planar multiple-turn coil (Part 1 of Coil 1). The number of turns of the helical coils in Coil 1 and Coil 2 is selected such that the overall electrical lengths of Coil 1 and Coil 2 are substantially similar. It is evident from FIG. 6 that the small openings of the split rings of Coils 1 and 2 are misaligned. While it is possible to provide a configuration where the openings are aligned, one skilled in the art will appreciate that such a configuration would result in a lower power coupling to the plasma in the location of the openings.

The input tuning capacitors ($C_1$ and $C_2$) and the output tuning capacitors ($C_3$ and $C_4$) allow for an adjustment of the current distribution in the coils in a manner similar to that discussed above with respect to FIGS. 3–5. The present embodiment advantageously allows for the current in one coil to be independently adjusted. In the aforementioned embodiments set forth in FIGS. 3–5, the current to each coil is primarily adjusted by the input tuning capacitor which changes the input impedance. As the input impedance of one coil changes, the overall input impedance changes, since the coils are electrically connected in parallel. This will in turn not only change the current in the one coil, but also change the current in the other coil. In other words, the current adjustments of two coils are not independent. As a result, the matching network has to be re-tuned in order to compensate for such a change in the overall input impedance. This may not be practical in all applications since the tuning range of the matching network is finite and limited.

In FIG. 6, the location of the current maximum in each coil can be shifted by adjusting the output capacitor to either a location in the planar multiple-turn coil (Part 1) or to a location in the helical coil (Part 2). The power coupling of the radio frequency to the plasma is relatively large when the current maximum is somewhere in the planar multiple-turn coil, since the planar coil is closer to the plasma. Similarly, if the current maximum is at a location in the helical coil, the power coupling to the plasma is weaker since the helical coil is further away from the plasma and the current drops off in the planar multiple-turn coil. Therefore, an adjustment of only the output capacitor can simultaneously change the location of the maximum current and the magnitude of the power coupling to the plasma. At the same time the output capacitor is being adjusted, the input capacitor can be adjusted in the opposite direction so as to maintain a relatively unchanged input impedance of the coil. As a result, the overall input impedance will remain relatively unchanged. One skilled in the art will appreciate that by adjusting the input and output capacitors in this way, the current magnitude does not change substantially, but rather the current standing wave pattern in the coil shifts, which in turn effectively changes the power coupling to the plasma. As a result, plasma uniformity can be controllably maintained.

Figure 7:
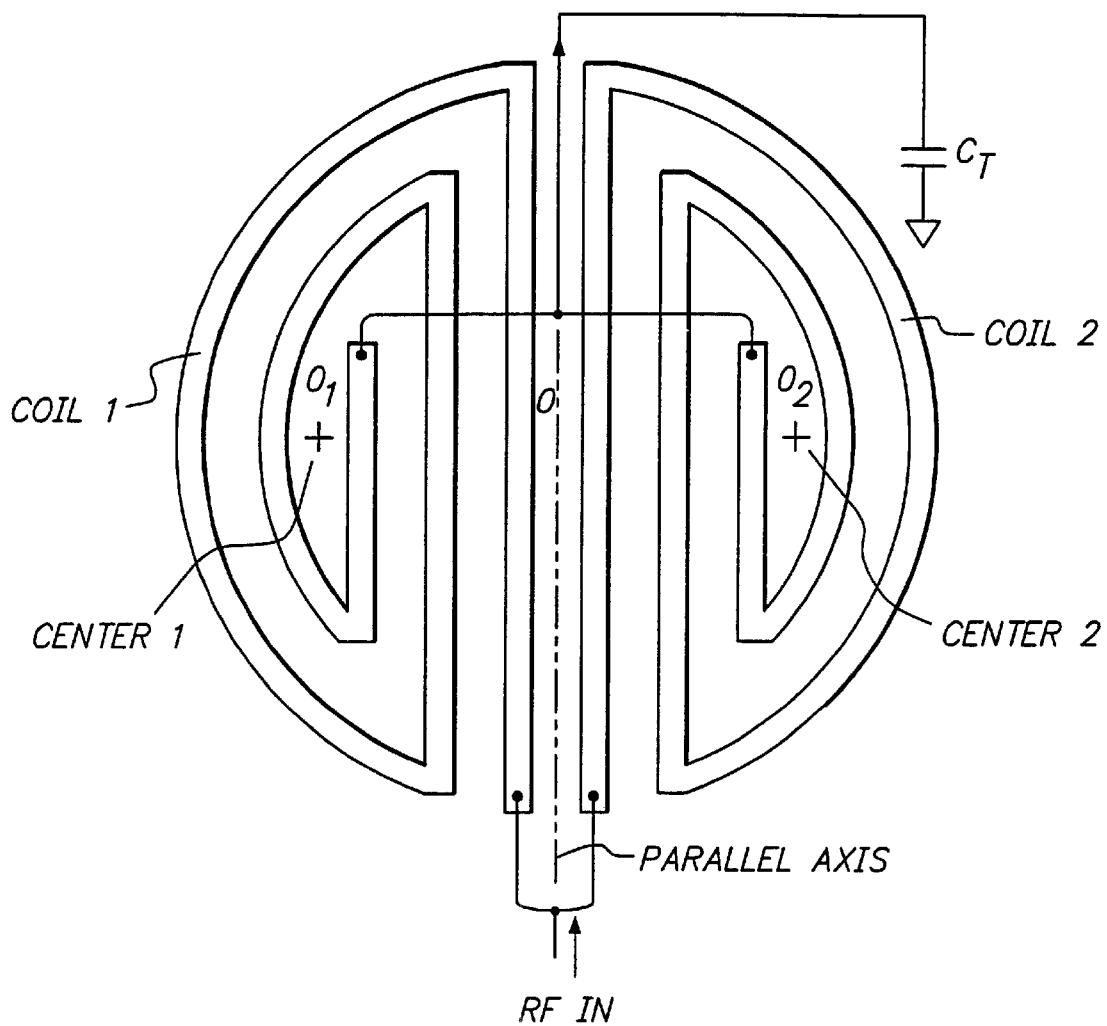
FIG. 7 depicts an exemplary arrangement of dual, multiple-turn planar coils with parallel antenna elements according to a fifth embodiment of the present invention.

FIG. 7 illustrates a dual-coil coupling system according to a fifth embodiment of the present invention. The dual-coil coupling system of FIG. 7 uses parallel antenna elements. The two coils (Coil 1 and Coil 2) are symmetric and each loop of the coils consists of a half circle and a parallel antenna element. The RF is fed simultaneously to the central parallel element of each coil (closer to the parallel axis) and the other ends of the coils are tied together and terminated to the ground through capacitor $C_T$.

In contrast to a planar spiral coil, the parallel antenna coupling scheme always produces a relatively large E-field in the center and can therefore intrinsically improve plasma uniformity (see J. J. Chen et al., "Parallel-Antenna Transformer-Coupled Plasma Generation Systems", U.S. patent application Ser. No. 09/052,144, filed Mar. 31, 1998). Similar to the conventional TCP™ coil, the plasma produced by each coil is toroidal and centered around $o_1$ for Coil 1, and $o_2$ for Coil 2. Compared with a single TCP™ coil, the radius of each plasma toroid is substantially shorter, thereby making it easier for plasma to diffuse into the center of the toroid compared to the conventional TCP™ system; the advantage of this coupling system is that there will be less variation of the RF current and voltage along each coil, since the electrical length of each coil is almost halved.

The foregoing has described the principles, preferred embodiments and modes of operation of the present invention. However, the invention should not be construed as being limited to the particular embodiments discussed above. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. An apparatus for generating an inductively coupled plasma, the apparatus comprising:
    a plasma reaction chamber having a window forming an electro-magnetic field path into the chamber and a process gas supply configured to introduce process gas into the chamber;
    a radio frequency antenna comprising at least first and second antenna segments disposed outside said plasma reaction chamber; and
    a radio frequency source coupled to the antenna segments and configured to resonate radio frequency currents in the antenna segments,
    a first input capacitor connected to the first antenna segment and a second input capacitor connected to the second antenna segment;
    the first and second antenna segments being tied together and terminated to ground through an impedance;
    wherein electro-magnetic fields induced by the radio frequency currents are effective to pass through the window and excite and ionize the process gas to thereby generate plasma within the chamber, and
    wherein said first antenna segment surrounds said second antenna segment.

2. The apparatus of claim 1, wherein a density of the generated plasma is substantially uniform within a region spanned by said at least first and second antenna segments.

3. The apparatus of claim 1, wherein each of said at least first and second antenna segments couples radio frequency power into different regions in the chamber, resulting in an overall relatively uniform plasma in the chamber.

4. The apparatus of claim 1, wherein the at least first and second antenna segments are made of single-turn coils.

5. The apparatus of claim 1, wherein the first antenna segment is made of a single-turn coil and the second antenna segment is made of a multiple-turn coil.

6. The apparatus of claim 1, wherein the at least first and second antenna segments are made of multiple-turn coils.

7. The apparatus of claim 1, wherein at least one of the first and second input capacitors is an input tuning capacitor for adjusting radio frequency currents within said at least first and second antenna segments so as to achieve equal radio frequency currents or unequal radio frequency currents.

8. The apparatus of claim 7, wherein the at least one input tuning capacitor provides a radio frequency current that is higher in a desired position along an antenna segment than at other positions along the antenna segment resulting in higher radio frequency power coupling to a region of plasma that is adjacent the desired position along the antenna segment than the radio frequency power coupling to regions of plasma adjacent the other positions along the antenna segment, or provides a radio frequency current that is lower in the desired position along the antenna segment than at other positions along the antenna segment resulting in lower power coupling to said region of plasma.

9. The apparatus of claim 7, wherein a pair of input capacitors are used to adjust radio frequency currents in a pair of antenna segments and are arranged such that the input capacitors are turned in opposite directions with a single control.

10. The apparatus of claim 1, wherein the at least first and second antenna segments are powered by the radio frequency source and tuned by a single matching network.

11. The apparatus of claim 1, wherein output ends of the first and second antenna segments are terminated to ground through separate output fixed or variable capacitors.

12. The apparatus of claim 11, wherein each of said output fixed or variable capacitors adjusts a location of a maximum or a minimum radio frequency current or a maximum or a minimum radio frequency voltage along each of said first and second antenna segments.

13. The apparatus of claim 11, wherein locations of maximum radio frequency current in the first and second antenna segments are a function of a rotational position of the first antenna segment relative to the second antenna segment, and
    wherein said output capacitors further adjust said locations so that the maximum radio frequency current locations are approximately 180 degrees apart azimuthally and opposite to each other radially, thereby substantially reducing plasma azimuthal non-uniformity due to an azimuthal non-uniform radio frequency current distribution.

14. The apparatus of claim 11, wherein a pair of said output fixed or variable capacitors adjust radio frequency currents in the first and second antenna segments and are arranged such that the pair of output fixed or variable capacitors are turned in opposite directions with a single control.

15. The apparatus of claim 1, wherein at least one of the first antenna segment and the second antenna segment are configured in at least one of a coplanar two dimensional configuration and a non-planar three dimensional configuration.

16. The apparatus of claim 1, wherein the first and second antenna segments are arranged concentrically with one of the antenna segments having a diameter smaller than another one of the antenna segments.

17. The apparatus of claim 15, wherein said three dimensional configuration is one of a dome or helical configuration.

18. The apparatus of claim 1, wherein each of the antenna segments is approximately circular in shape.

19. The apparatus of claim 1, wherein said at least first and second antenna segments are disposed proximate an exterior surface of the window of the chamber.

20. The apparatus of claim 1, wherein radio frequency currents within the first and second antenna segments travel in a same azimuthal direction around said segments.

* * * * *